(12) United States Patent
Hurwitz et al.

(10) Patent No.: US 12,316,302 B2
(45) Date of Patent: May 27, 2025

(54) HYBRID BAND-PASS FILTER WITH INTEGRATED PASSIVE DEVICE AND ACOUSTIC RESONATOR

(71) Applicant: Zhuhai Crystal Resonance Technologies Co., Ltd., Tianjin (CN)

(72) Inventors: Dror Hurwitz, Tianjin (CN); Chuanxiang Dai, Tianjin (CN); Ming Tian, Tianjin (CN)

(*) Notice: Subject to any disclaimer, the term of this patent is extended or adjusted under 35 U.S.C. 154(b) by 241 days.

(21) Appl. No.: 17/975,898

(22) Filed: Oct. 28, 2022

(65) Prior Publication Data
US 2024/0113694 A1    Apr. 4, 2024

(51) Int. Cl.
*H03H 9/54* (2006.01)
*H03H 9/205* (2006.01)
*H03H 9/60* (2006.01)

(52) U.S. Cl.
CPC ............ *H03H 9/542* (2013.01); *H03H 9/205* (2013.01); *H03H 9/605* (2013.01)

(58) Field of Classification Search
CPC ...... H03H 9/605; H03H 9/568; H03H 9/0542; H03H 9/205; H03H 9/0557; H03H 9/542; H03H 9/6483; H03H 7/0115; H03H 7/1758
See application file for complete search history.

(56) References Cited

U.S. PATENT DOCUMENTS

| | | | |
|---|---|---|---|
| 2013/0106532 A1* | 5/2013 | Jin | H03H 7/1758 333/175 |
| 2014/0035702 A1* | 2/2014 | Black | H03H 7/075 333/186 |
| 2018/0302062 A1* | 10/2018 | Sugaya | H03H 9/6489 |
| 2019/0222200 A1* | 7/2019 | Takamine | H03H 9/0566 |
| 2019/0326880 A1* | 10/2019 | Figueredo | H03H 9/173 |
| 2019/0326883 A1* | 10/2019 | Kim | H03H 7/1725 |
| 2020/0358419 A1* | 11/2020 | Yusuf | H05K 1/0243 |

\* cited by examiner

*Primary Examiner* — Quan Tra
(74) *Attorney, Agent, or Firm* — Wiggin and Dana LLP (57) ABSTRACT

A novel hybrid band-pass filter is realized using semiconductor integrated hybrid technology, and includes two acoustic resonance units, and one IPD filter unit. The filter unit may be implemented as a high-pass filter, a low-pass filter, or a band-pass filter. The two acoustic resonance units and the IPD filter unit are arranged on a matching substrate, for example, by way of flip-chip technology and welding of electrodes, and a polymer filled shell is formed external to and surrounding the acoustic resonance units and the IPD filter unit to prevent oxidation and to maintain integrity of the weld points. The first acoustic resonance unit is connected with an input terminal of the IPD filter through a matching inductor, an output terminal of the IPD filter is connected with the second acoustic resonance unit through a matching inductor, and finally, the two acoustic resonance units and the IPD filter unit are integrated on the matching substrate. The band-pass filter is characterized by low loss, high suppression, wide passband and high rectangular coefficient, and also has the advantages of small size, high yield, good batch consistency and suitability for batch production.

11 Claims, 5 Drawing Sheets

HYBRID BAND-PASS FILTER WITH INTEGRATED PASSIVE DEVICE AND ACOUSTIC RESONATOR

CROSS-REFERENCE TO RELATED APPLICATIONS

This application claims the benefit of priority under 35 U.S.C. § 119(a) to Chinese Patent Application No. 202211213628.0, filed Sep. 30, 2022, which is herein incorporated by reference in its entirety.

FIELD OF THE INVENTION

The present invention generally relates to the technical field of electronics, and more specifically relates to an integrated hybrid band-pass filter.

BACKGROUND OF THE INVENTION

With the rapid development and expansion of various types of wireless communication and signaling, filtering in order to avoid unwanted interference has become a paramount design consideration in wireless or RF (radio frequency) systems. In the area of mobile communication, mobile phone radio frequency filters have become quite critical. In a radio frequency front-end module, the radio frequency filter plays a vital role. The radio frequency filter is used to filter out-of-band interferences and noises to meet the appropriate signal-to-noise (SNR) requirements of radio frequency systems and communication protocols. With the increasing complexity of the communication protocols, in-band signal passthrough and out-of-band signal suppression demands are increasing, which makes the design of filters more and more challenging.

Various equipment and chip suppliers have begun to provide 5G commercial mobile phones and chips in recent years. Compared with the previous mobile communication network protocols, 5G communication has newly added frequency bands, and the newly-added frequency bands are relatively wide, mainly including: 3.3 GHz to 3.8 GHz, 3.3 GHz to 4.2 GHz, 4.4 GHz to 5.0 GHz, 24.25 GHz to 29.5 GHz, and the like. With the continued rollout of 5G communication, the number of frequency bands needing to be supported by the mobile phones is increasing. As each frequency band needs a filter, the number of filters needing to be used in the mobile phones is also increasing. However, in the context of a portable mobile device, the size and power consumption of these filters often present challenging design considerations.

At present, miniaturized filter designs mainly include LTCC (Low Temperature Co-fired ceramic), IPD (Integrated Passive Device), SAW (Surface Acoustic Wave), BAW (Bulk Acoustic Wave), FBAR (Film Bulk Acoustic Resonator), and the like. The LTCC filter is disadvantageous for a mobile application, as it typically is large in size and suffers from poor consistency as the LTCC filter is made by screen printing and multilayer lamination technology. An IPD filter is relatively smaller in size since it is typically implemented with a planar spiral inductor and a MIM (metal insulator metal) capacitor. However, an IPD filter is not ideal since the Q value of the inductor is low, the in-band loss is large, and a rectangular coefficient is poor. In general, SAW, BAW and FBAR are not suitable for making wideband filters.

The rapid development of 5G communication technology has resulted in more challenging requirements for RF devices in terms of miniaturization, handling of higher frequencies, higher performance, low power consumption and low cost. As a core component of the front end of an RF device, the BAW filter can advantageously provide higher operating frequency, low insertion loss, withstand higher power, all while presenting a relatively small size.

In 5G mobile communication terminal equipment, BAW filters are widely adopted for use in the frequency range of 2.5 GHz to 6 GHz. BAW filters are typically either FBAR (Film Bulk Acoustic Resonator) structures or BAW-SMR (Solidly Mounted Resonator) structures. In the case of an FBAR filter, the thin film bulk acoustic wave resonator is the main component of the FBAR filter. The active portion of an FBAR filter is constructed as a sandwich piezoelectric oscillation stack composed of a metal bottom electrode, a metal top electrode, and a piezoelectric film in between the two electrodes. Strong c-axis texture is an important characteristic for FBAR filters formed using AlN or AlScN materials, because the acoustic mode in such filters needs to be longitudinally activated.

When an electrical signal is imposed on the thin film BAW resonator, the piezoelectric film in the device converts the electrical signal into an acoustic signal through the inverse piezoelectric effect. The unique acoustic structure of the device exhibits selectivity for acoustic signals of different frequencies. The acoustic signal that satisfies the condition of total acoustic wave reflection in the device will achieve resonance, and the acoustic signal that does not meet the resonance condition will be attenuated. Since the operating frequency of the thin film BAW resonator is inversely proportional to the thickness of the piezoelectric material, the thickness of the piezoelectric layer determines the operating frequency range of the resulting BAW device.

Currently, the piezoelectric layer of most BAW filters is constructed using AlN polycrystalline films. Polycrystalline films with a preferred c-axis orientation are usually grown epitaxially on the surface of Si substrates using PVD sputtering techniques. However, this approach suffers from several disadvantages. First, due to the lattice mismatch with the substrate, the epitaxial AlN film on Si substrate is generally polycrystalline with rocking-curve full width at half maximum (FWHM) more than 1.6 degrees at 500 nm thickness, where rocking-curve refers to a plot of x-ray intensity vs. incident angle defined between the x-ray source and the sample being measured. The AlN crystal quality is poor, and the dislocation defect density is high, which seriously affects the performance and reliability of the device. Although polycrystalline films also have a c-axis orientation, their performance as a thin piezoelectric layer is generally not as good as single crystal films, and much worse than single crystal films when operating the BAW filter at higher frequency ranges. The AlN film obtained using this method has a polycrystalline structure, and its piezoelectric coupling coefficient is between 6-7%, which makes it difficult to meet the bandwidth requirements of 5G communication.

One way to increase the operating bandwidth is to dope the AlN film with a rare earth material, usually Scandium (Sc). In this way, the electromechanical coupling coefficient of piezoelectric materials may be somewhat improved according to the doping elements and concentrations. However, the quality factor (Q value) of the resonator will decrease accordingly, because the stiffness (Stiffness) of the doped film will decrease compared to the AlN film without the rare earth metal additive. Therefore, the insertion loss of the filter will increase, resulting in a deterioration of the filtering performance and an increase in power consumption.

As discussed herein, the thickness of the piezoelectric film in the FBAR filter is inversely proportional to the operating frequency. Filters operating at extremely high frequencies, such as 10 GHz, have a thickness of about 200 nm. Creating such Ultra-thin piezoelectric materials has been quite challenging. The thinner the piezoelectric film, the more difficult it is to maintain the proper hardness, and its own crystal defects and pressure are more likely to cause cracks. Moreover, after the polycrystalline AlN doping, the crystal orientation becomes worse and an AlN seed layer is needed, which leads to an even thinner actual piezoelectric layer and a lowering of the actual doping used.

Compared with the polycrystalline AlN film, a single crystal AlN film has the advantages of higher acoustic velocity speed, better crystallinity, higher piezoelectric constant and electromechanical coupling coefficient, which will enable BAW filters to meet the higher bandwidth and stricter performance requirements of 5G communications. Therefore, next-generation high-frequency FBARs require defect-free or nearly defect-free single-crystal thin films. High quality single crystal piezoelectric film, as represented by x-ray diffraction (XRD) results of the (002) plane having a (FWHM) of less than 1 degree, have been developed and fabricated using a unique process as described in U.S. Pat. No. 10,797,681 B1 of Dror Hurwitz entitled Method of Fabricating Novel Packages for Electronic Components, which is incorporated by reference herein in its entirety. These single crystal piezoelectric films typically have a thickness of 200 nm to 1000 nm. Additionally, the smoothness of the resulting film has a roughness of less than 1 nm. The films exhibit a strong c-axis orientation normal to the (002) plane, with rocking-curve FWHM less than 1 degree Currently, the common method to grow AlN or AlScN involves PVD sputtering to deposit the piezoelectric film on a Si or SiO2 substrate. However, with this approach, it is generally not possible to obtain single crystal AlN or AlScN because of huge lattice mismatch. In U.S. Pat. No. 10,797,681, a method of fabricating single AlN or AlScN is disclosed, which uses a "film transferring concept". This approach involves an AlScN piezoelectric film being deposited on sapphire/GaN substrate (generally available sapphire wafer coating with GaN) resulting in a single crystal AlScN film with small lattice mismatch. Next, an epitaxial AlScN film is bonded to the Si substrate using a Au—Au bonding process. Continuing, a 248 nm laser is used to scan the wafer from the back of the transparent sapphire substrate, due to the small band gap of GaN (3.4 ev compared to sapphire). The laser passes through the sapphire and is absorbed by the GaN layer which is then decomposed. The sapphire is separated, resulting in the epitaxially grown single crystal AlScN piezoelectric film being transferred to the Si substrate.

Therefore, there is an acute need for a small size band-pass filter which can still provide a wide passband with low loss, as well as exhibiting a high rectangular coefficient.

SUMMARY OF THE INVENTION

To implement the foregoing objects and address the above-stated needs, the present invention in an embodiment combines the characteristics of an IPD filter and an acoustic filter to in the form of an integrated hybrid band-pass filter which combines both an IPD filter, as well as multiple acoustic wave resonators. The hybrid band pass filter according to an embodiment of the present invention includes a first acoustic resonance unit, an IPD filter unit, a second acoustic resonance unit, a matching substrate, a polymer filled shell and a signal port. The IPD filter may be implemented as a high-pass, low-pass, or band-pass filter, according to the particular implementation and objective.

According to one embodiment of the present invention, the input signal is provided to a first acoustic resonance unit, which in turn is connected with an input terminal of the IPD filter through a matching inductor. The output terminal of the IPD filter is connected with the second acoustic resonance unit through a matching inductor, which in turn provides the desired filtered signal. The two acoustic resonance units and the IPD filter are integrated on a matching substrate using flip-chip technology.

Further, in one embodiment, the first acoustic resonance unit and the second acoustic resonance unit each include at least one series acoustic resonator and at least one parallel acoustic resonator.

Further, in one embodiment of the present invention, the IPD filter is a high-pass filter or band-pass filter prepared on a substrate made of Si, GaAs, glass, or sapphire, which is fabricated using photoetching, etching, deposition and sputtering processes.

Further, in one embodiment of the present invention, the matching substrate includes an input port matching inductor, an output port matching inductor, a connecting inductor between the first acoustic resonance unit and the IPD filter, a connecting inductor between the IPD filter and the second acoustic resonance unit, and at least one grounding inductor connected with the parallel acoustic resonator.

Further, in one embodiment according to the present invention, the signal port includes one input terminal, one output terminal and at least one grounding terminal.

Further, the matching substrate is a substrate prepared by a multilayer lamination process and includes a ceramic substrate and a PCB substrate, and a communication loop is formed in the matching substrate by connecting a through hole with the signal port.

The integrated hybrid band-pass filter of the present invention has the advantageous characteristics of small size, light weight, low loss, high suppression, wide passband and high rectangular coefficient. Moreover, the integrated hybrid band-pass filter according to the present invention is prepared using well developed semiconductor processing techniques and equipment, which therefore results in a filter having high process precision making it quite suitable for mass manufacturing.

BRIEF DESCRIPTION OF THE DRAWINGS

For a better understanding of the invention and to show how it may be carried into effect, reference will now be made, purely by way of example, to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In particular, it will be appreciated that the schematic illustrations are not to scale, and the thickness of some very thin layers is exaggerated. In the accompanying drawings.

DESCRIPTION OF REFERENCE NUMERALS 1 refers to first acoustic resonance unit; 2 refers to IPD filter; 3 refers to second acoustic resonance unit; 4 refers to matching substrate; 5 refers to polymer filled shell; 6 refers to signal port; 11 refers to first acoustic resonance input terminal; 12 refers to first acoustic resonance output terminal; 13 refers to series acoustic resonator A1; 14 refers to parallel acoustic resonator B1; 15 refers to grounding port; 16 refers to empty port; 21 refers to IPD input terminal; 22 refers to IPD output terminal; 23 refers to inductor L4; 24 refers to inductor L5; 25 refers to capacitor C2; 26 refers to capacitor C1; 27 refers to capacitor C3; 28 refers to grounding terminal; 29 refers to grounding terminal; 210 refers to empty port; 31 refers to second acoustic resonance input terminal; 33 refers to second acoustic resonance output terminal; 33 refers to series acoustic resonator A2; 34 refers to parallel acoustic resonator B2; 35 refers to grounding terminal; 36 refers to parallel acoustic resonator B3; 37 refers to grounding terminal; 38 refers to empty port; 41 refers to inductor L1; 42 refers to inductor L2; 43 refers to inductor L3; 44 refers to inductor L6; 45 refers to inductor L8; 46 refers to inductor L7; 47 refers to inductor L9; 61 refers to input terminal S1; 62 refers to grounding terminal G1; and 63 refers to output terminal S2.

DETAILED DESCRIPTION OF INVENTION

In order to make the technical means, innovative features, achieved objects and effects of the present invention easy to understand, the present invention will be further explained with reference to the specific embodiments.

Figure 1:
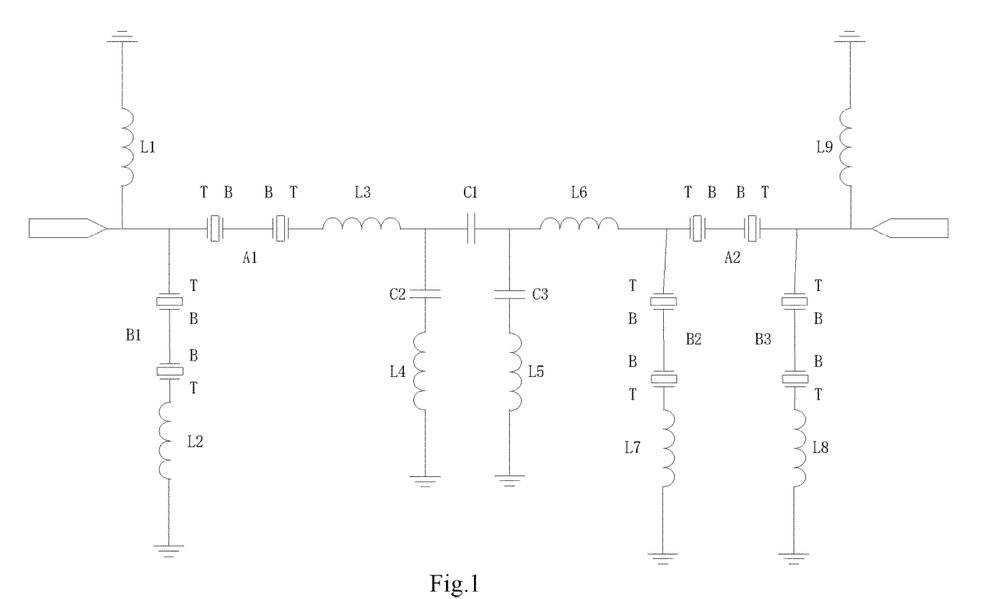
FIG. 1 is a schematic circuit diagram of a first embodiment integrated hybrid band-pass filter of the present invention.

Referring now to FIG. 1, therein is shown a circuit structure of a band-pass filter according to a first embodiment of the present invention. This general arrangement of the band-pass filter includes a first acoustic resonance unit, an IPD filter, and a second acoustic resonance unit. More specifically, the band-pass filter of FIG. 1 includes a first acoustic resonance unit having one series acoustic resonator and one parallel acoustic resonator. Next in the arrangement is a third-order elliptic function high-pass filter implemented as an IPD filter. This is followed by a second acoustic resonance unit having one series acoustic resonator and two parallel acoustic resonators. The band-pass filter additionally includes two port matching inductors, two connecting inductors and three grounding inductors connected with the parallel acoustic resonators.

In this first embodiment band-pass filter, an input terminal S1 is connected to one end of a series acoustic resonator A1, the other end of the series acoustic resonator A1 being connected with one end of a capacitor C1 through a matching inductor L3. The other end of the capacitor C1 is connected with one end of a series acoustic resonator A2 through a matching inductor L6, and the other end of the series acoustic resonator A2 is connected with an output terminal S2. A port matching inductor L1 is connected at one end with the input terminal S1, the other end of the port matching inductor L1 being connected to ground.

One end of a parallel acoustic resonator B1 is connected between the input terminal S1 and the series acoustic resonator A1, the other end of the parallel acoustic resonator B1 is connected with an inductor L2, and the other end of the inductor L2 is grounded. A capacitor C2 is connected between the matching inductor L3 and the capacitor C1, the inductor C2 is connected with an inductor L4, and the other end of the inductor L4 is grounded. A capacitor C3 is connected between the capacitor C1 and the matching inductor L6. Specifically, one end of the capacitor C3 is connected between the capacitor C1 and the other end of capacitor C3 is connected to inductor L5, which in turn is connected to ground. One end of a first parallel acoustic resonator B2 is connected between the matching inductor L6 and the series acoustic resonator A2, the other end of the parallel acoustic resonator B2 is connected with one end of an inductor L7, and the other end of the inductor L7 is grounded. One end of a second parallel acoustic resonator B3 is connected between the series acoustic resonator A2 and the output terminal S2, the other end of the parallel acoustic resonator B3 is connected with one end of an inductor L8, and the other end of the inductor L8 is grounded. Finally, the output terminal S2 is connected with one end of a port matching inductor L9, the other end of which is grounded.

Figure 2:
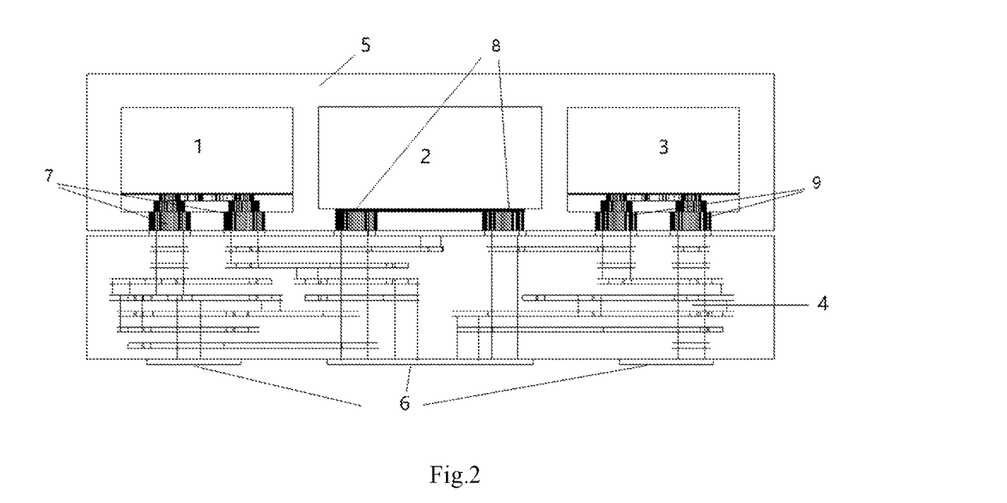
FIG. 2 is a structural diagram of the first embodiment filter shown in FIG. 1.

The resonators shown in FIG. 1, for example, A1, B1, etc., can optionally each be composed of two separate resonators, as shown. As shown in FIG. 1, resonator A1 may be composed of two separate resonators, which are connected bottom-to-bottom. In FIG. 2, "B" refers to the bottom electrode of a particular resonator, while "T" refers to the top electrode of the resonator. So, in the case of resonator A1, it is composed of two resonators whose bottom electrodes are connected together. Similarly, the other resonators illustrated (i.e., B1, B2, A2, B3) are each made up of two separate resonators whose bottom electrodes are connected together. It should be understood that this optional use of two resonators connected bottom-to-bottom may be used for some, all, or possibly none of the resonators, depending on the particular application and circuit design.

As shown in FIG. 2, the band-pass filter according to the first embodiment of the present invention includes the first acoustic resonance unit 1, the IPD filter 2, and the second acoustic resonance unit 3. These three sub-units are arranged on a matching substrate 4 contained within a polymer filled shell 5 and having a signal port 6 for signal input/output interconnection. The arrangement also includes port connection columns 7, 8, and 9. These port connection columns 7, 8, and 9 are used to make metal convex points in the various electrodes, which then allows press welding of the metal convex points to corresponding electrode areas on the substrate 4. This allows the connection of corresponding leads to the ports of the first acoustic resonance unit 1, the IPD filter 2 and the second acoustic resonance unit 3. As described herein, the first acoustic resonance unit 1 is connected with an input terminal of the IPD filter through a matching inductor, while an output terminal of the IPD filter is connected with the second acoustic resonance unit through a matching inductor. Finally, the two acoustic resonance units and one IPD filter are integrated on the matching substrate 4 using flip-chip interconnection techniques. Additionally, polymer filler is used to mold the matching substrate, which has all the necessary components attached prior to the molding process. External to the first acoustic resonance unit 1, IPD filter 2, and second acoustic resonance unit 3, a polymer filled shell 5 is formed having generally the same length and width as the matching substrate 4. One function of the polymer filled shell 5 is to keep out air so as to prevent circuit oxidation in order to protect the stability of the various weld points. In a particular embodiment, the package size of the resulting integrated hybrid band-pass filter is approximately 2.0 mm×1.25 mm×0.6 mm.

Figure 3:
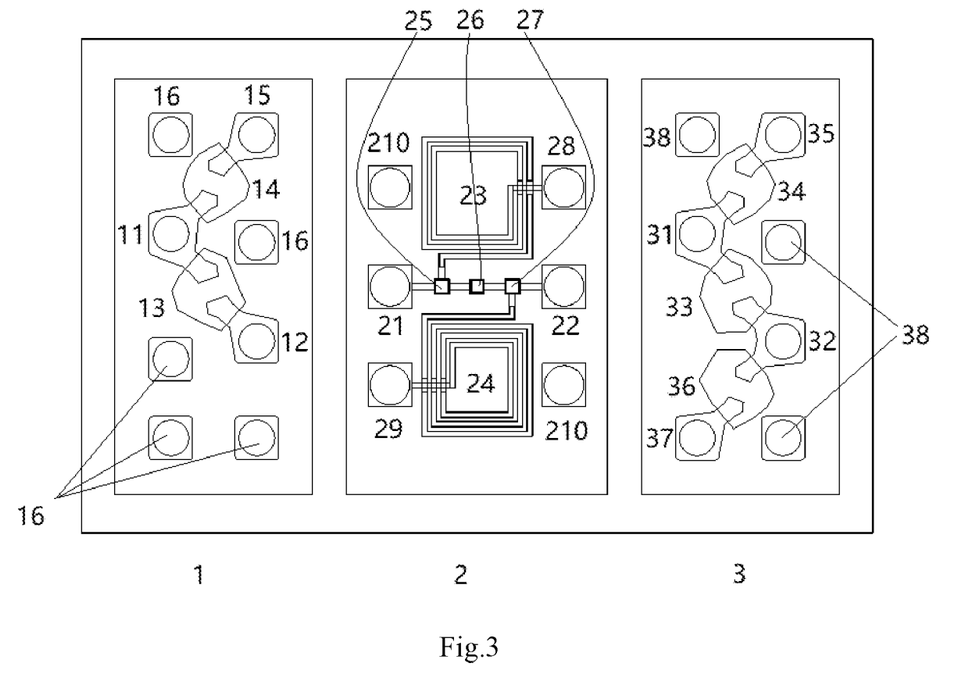
FIG. 3 is a schematic plan view of the first embodiment filter shown in FIG. 1.
Figure 4:
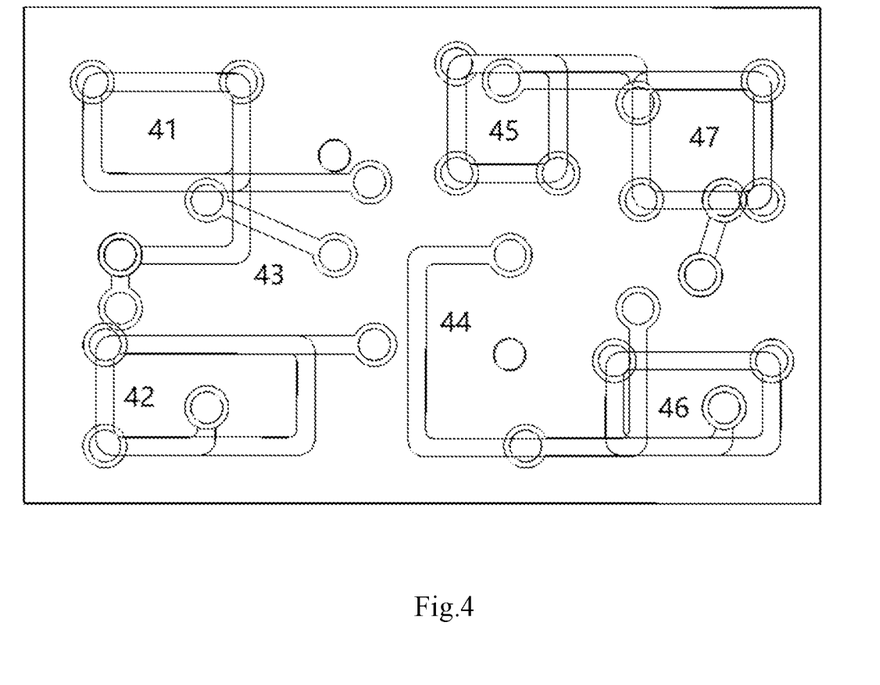
FIG. 4 is a schematic diagram of a matching substrate for use with the first embodiment filter shown in FIG. 1.
Figure 5:
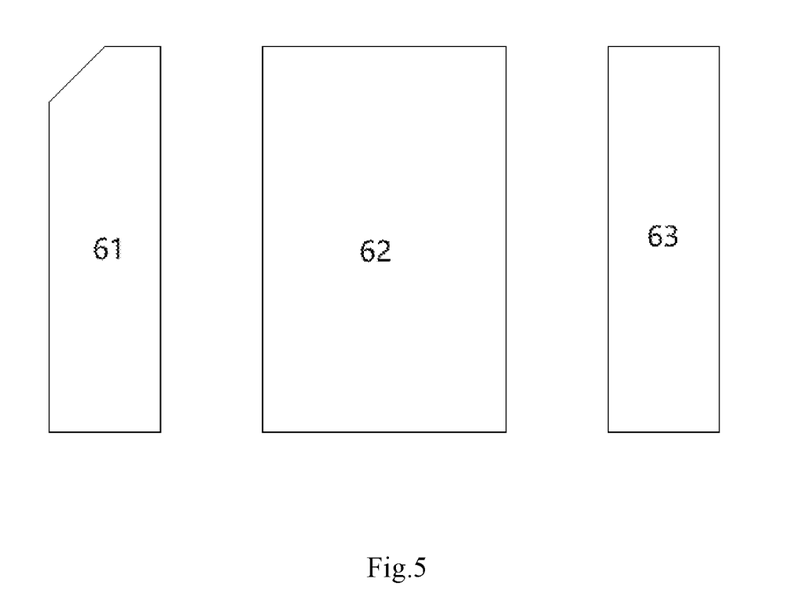
FIG. 5 is a schematic diagram showing the arrangement of an input terminal, grounding terminal, and output terminal for use with the first embodiment filter shown in FIG. 1.

As shown in FIG. 3, FIG. 4 and FIG. 5, the integrated hybrid band-pass filter according to the first embodiment of the present invention uses two symmetrical FBAR resonators connected in series to form a group of resonance due to a high working frequency of the embodiment and a small area of a single FBAR resonator. By splitting a single resonator into two symmetric resonators in a series path or a parallel path, it is possible to achieve better performance. Specifically, if a single resonator is used, the available area may be too small; however, if the single resonator can be split into two resonators, it may be possible to provide a resulting resonator with increased area. Typically, the performance of the resonator will be improved when a larger area is provided for implementing the resonator. The first acoustic resonance unit 1 includes the port matching inductor L1 (41), the series acoustic resonator A1 (13), the parallel acoustic resonator B1 (14) and the inductor L2 (42). The IPD filter unit includes the inductor L4 (23), the inductor L5 (24), the capacitor C1 (26), the capacitor C2 (25) and the capacitor C3 (27). The second acoustic resonance unit 2 includes the inductor L7 (46), the inductor L8 (45), the series acoustic resonator A2 (33), the parallel acoustic resonator B2 (34), the parallel acoustic resonator B3 (36) and the port matching inductor L9 (47).

The physical connection of the elements of the band-pass filter of the first embodiment of the present invention is as follows. The input terminal S1 (61) of the hybrid filter (see FIG. 5) is connected with an input terminal 11 of the first acoustic resonance unit via a through hole. Specifically, the input terminal 11 is connected with the series acoustic resonator A1 (13), and the series acoustic resonator A1 (13) is connected with an output terminal 12, which in turn is connected with an input terminal 21 of the IPD through the matching inductor L3 (43). The input terminal 21 of the IPD is also connected with one end of the capacitor C1 (26), with the other end of the capacitor C1 (26) being connected with an output terminal 22 of the IPD. The output terminal 22 of the IPD is in turn connected with an input terminal 31 of the second acoustic resonance unit through the matching inductor L6 (44). The input terminal 31 is also connected with one end of the series acoustic resonator A2 (33), and the other end of the series acoustic resonator A2 (33) is connected with an output terminal 32 of the second acoustic resonance unit. The output terminal 32 is also connected with an output terminal S2 (63) of the hybrid filter via a through hole.

The grounding inductor L1 (41) is connected between the input terminal S1 (61) of the hybrid filter and the input terminal 11 of the first acoustic resonance unit. The parallel acoustic resonator B1 (14) is connected between the input terminal 11 of the first acoustic resonance unit and the series acoustic resonator A1 (13), and the other end of the parallel acoustic resonator B1 (14) is connected with a port 15, which in turn is connected with the inductor L2 (42) via a through hole. The other end of the inductor L2 (42) is connected with a grounding terminal 62 via a through hole. The capacitor C2 (25) is connected at one end between the input terminal 21 of the IPD and the capacitor C1 (26), while the other end of the capacitor C2 (25) is connected with the inductor L4 (23). The inductor L4 (23) is connected with a grounding port 28, and the grounding port 28 is connected with the grounding terminal (62) via a through hole. The capacitor C3 (27) is connected at one end between the capacitor C1 (26) and the output terminal 22 of the IPD, while the other end of the capacitor C3 (27) is connected with the inductor L5 (24). The inductor L5 (24) is connected with a grounding port 29, and the grounding port 29 is connected with the grounding terminal (62) via a through hole.

The parallel acoustic resonator B2 (34) is connected at one end between the input terminal 31 of the second acoustic resonator unit and the series acoustic resonator A2 (33), while the other end of the parallel acoustic resonator B2 (34) is connected with a port 35. The port 35 is connected with one end of the inductor L7 (46) via a through hole, and the other end of the inductor L7 (46) is connected with the grounding terminal 62 via a through hole. The parallel acoustic resonator B3 (36) is connected at one end between the series acoustic resonator A2 (33) and the output terminal 32 of the second acoustic resonance unit, while the other end of the parallel acoustic resonator B3 (36) is connected with a port 37. The port 37 is connected with the inductor L8 (45) via a through hole, and the inductor L8 (45) is connected with the grounding terminal 62 via a through hole. The grounding inductor L9 (47) is connected between the output terminal 32 of the second acoustic resonance unit and the output terminal S1 (63).

Figure 6:
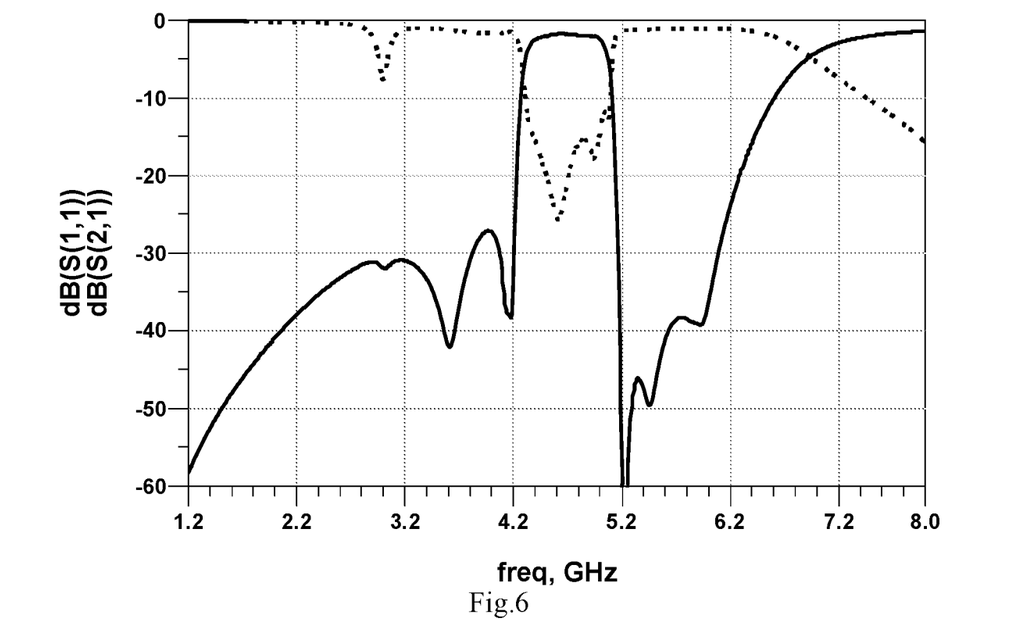
FIG. 6 is a frequency attenuation plot of simulation results according to the first embodiment filter shown in FIG. 1.

FIG. 6 shows simulation results of a three-dimensional electromagnetic field of the frequency attenuation provided by the band-pass filter according to the first embodiment of the present invention. It can be seen from the simulation results that a center frequency of the band-pass filter is 4.7 GHz. The passband bandwidth ranges from 4.4 GHz to 5.0 GHZ, and an insertion loss in the passband is less than 2.5 dB. In an attenuation band, the suppression is more than 30 dB in the range from DC to 4.2 GHz and more than 35 dB in the range from 5.15 to 5.85 GHz.

Figure 7:
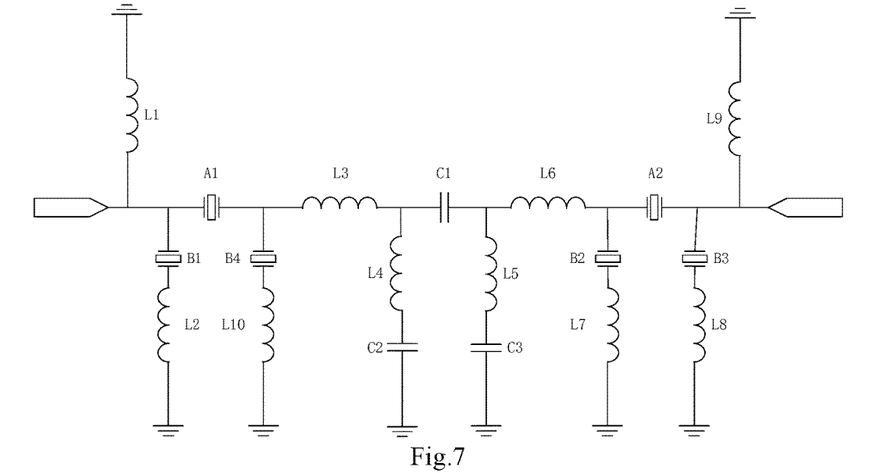
FIG. 7 is a schematic circuit diagram of a second embodiment integrated hybrid band-pass filter of the present invention.

Referring now to FIG. 7, therein is shown a circuit structure of a hybrid band-pass filter according to a second embodiment of the present invention. This second embodiment is similar in some respects to the first embodiment illustrated in FIG. 1, and similar components have been marked using similar reference numerals in both figures. However, in contrast to the first embodiment described above, this second embodiment filter includes a first acoustic resonance unit including one series acoustic resonator and two parallel acoustic resonators. The second parallel acoustic resonator is made up of a series connection of parallel acoustic resonator B4 and inductor L10. Similar to the first embodiment, a third-order elliptic function high-pass filter is employed as an IPD filter. Again, similar to the first embodiment described above, the second embodiment filter shown in FIG. 7 includes a second acoustic resonance unit having one series acoustic resonator and two parallel acoustic resonators. Additionally, there are two port matching inductors, two connecting or matching inductors and four grounding inductors, each connected to one of the parallel acoustic resonators. In contrast to the circuit layout presented in FIG. 1, in the circuit layout of FIG. 7, the series L-C arrangements are reversed with respect to FIG. 1. Specifically, in FIG. 1, C2 is connected to L4 and L4 is grounded, and C3 is connected to L5 and L5 is grounded. In the embodiment of FIG. 7, L4 is connected to C2 and C2 is grounded, and L5 is connected to C3 and C3 is grounded. In terms of electrical performance, there should be no difference between the operation of either arrangement of FIG. 1 and FIG. 7.

Figure 8:
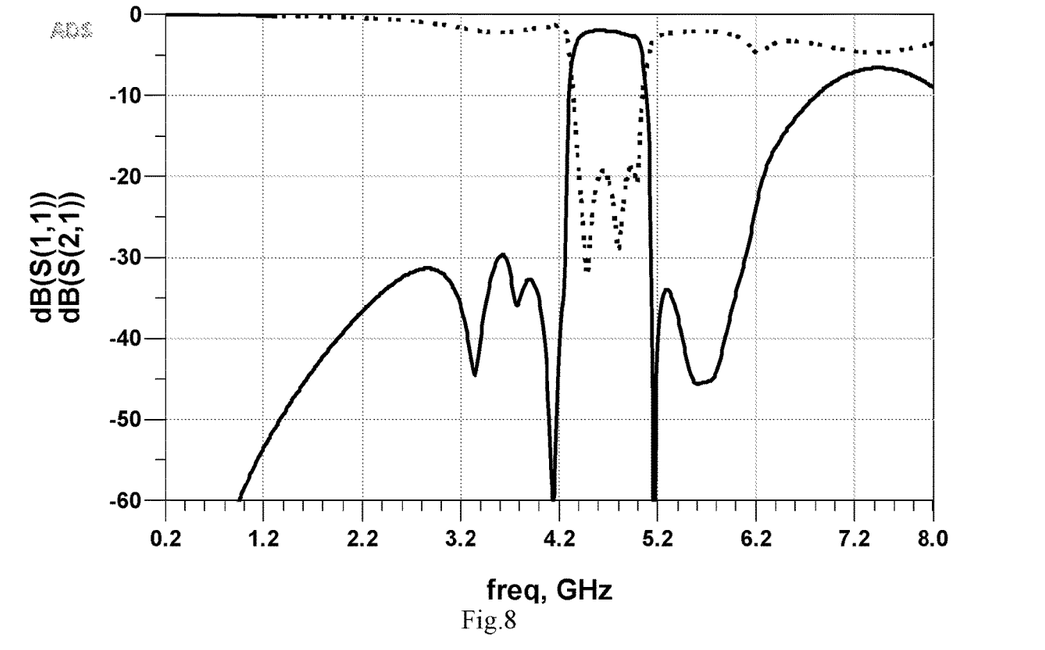
FIG. 8 is a frequency attenuation plot of simulation results according to the second embodiment filter shown in FIG. 7.

FIG. 8 shows simulation results of a three-dimensional electromagnetic field of the frequency attenuation provided by the band-pass filter according to the second embodiment of the present invention. It can be seen from the simulation results that the results of the second embodiment hybrid filter are similar to those of the first embodiment. It should be noted that the insertion loss in the pass-band is increased slightly as one more parallel acoustic resonator is used in the hybrid band-pass filter.

Figure 9:
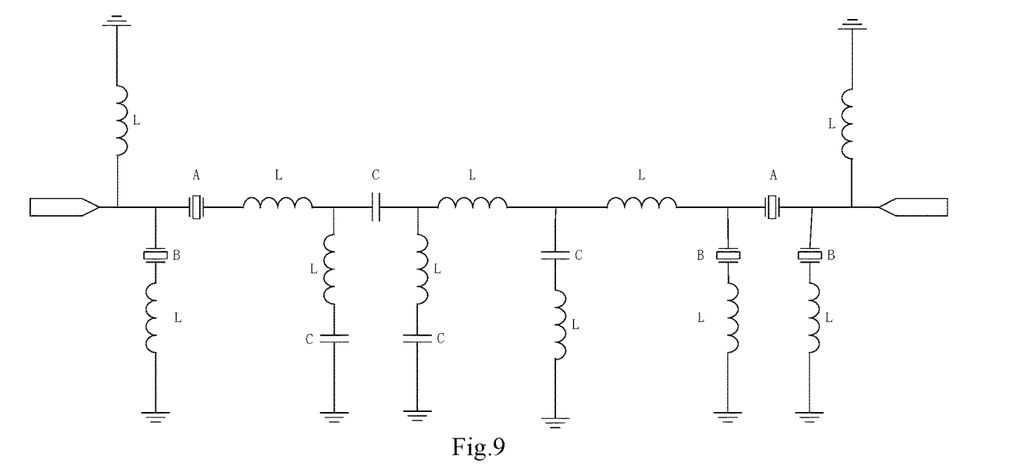
FIG. 9 is a schematic circuit diagram of a third embodiment integrated hybrid band-pass filter of the present invention.

Referring now to FIG. 9, therein is shown a circuit structure of a band-pass filter according to a third embodiment of the present invention. Similar to the first embodiment filter described above, in this third embodiment circuit, a first acoustic resonance unit includes one series acoustic resonator and one parallel acoustic resonators. In contrast though, in this third embodiment, the IPD band-pass filter is implemented using a third-order elliptic function high-pass filter cascaded with a third-order elliptic function low-pass filter. A second acoustic resonance unit includes one series acoustic resonator and two parallel acoustic resonators. Additionally, there are two port matching inductors, two connecting inductors and three grounding inductors, each connected to one of the parallel acoustic resonators. It should be noted that the inductor at the right end of the low-pass filter in the IPD filter is also used as a matching connecting inductor.

Figure 10:
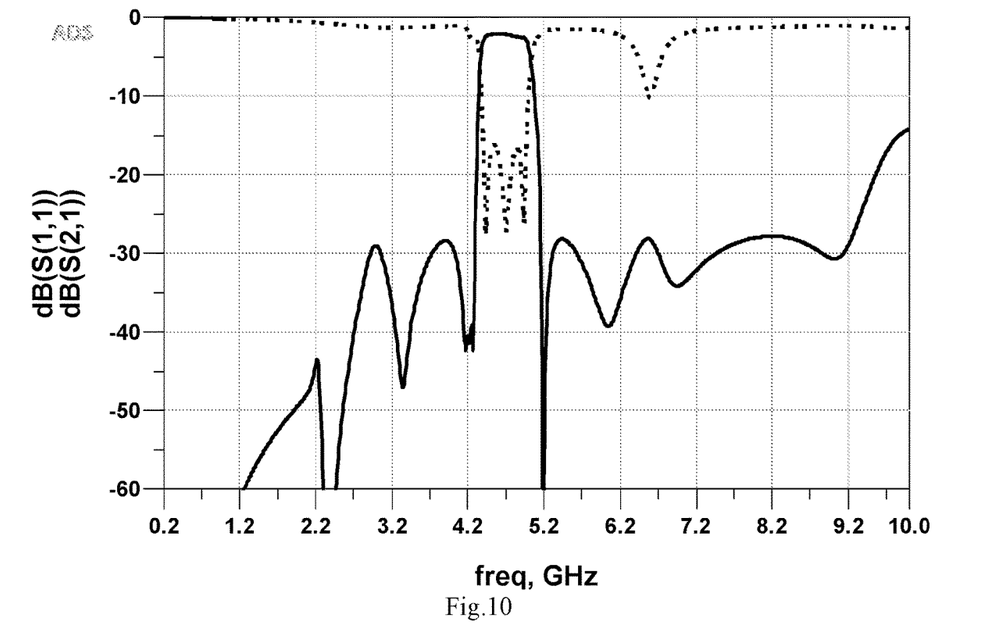
FIG. 10 is a frequency attenuation plot of simulation results according to the third embodiment filter shown in FIG. 9.

FIG. 10 shows circuit simulation results of the frequency attenuation of the band-pass filter according to the third embodiment of the present invention. It can be seen from the simulation results that a center frequency of the band-pass filter is 4.7 GHz. The passband bandwidth ranges from 4.4 GHz to 5.0 GHZ, and an insertion loss in the passband is less than 3.0 dB. In an attenuation band, the suppression is more than 30 dB in the range from DC to 4.2 GHz, and more than 30 dB in the range from 5.15 to 9.2 GHz. As compared with the previous embodiments discussed above, this third embodiment greatly expands the out-of-band suppression at the high frequency end by sacrificing a small amount of in-band loss.

The integrated hybrid band-pass filter provided by the present invention has the advantageous characteristics of small size, light weight, low loss, high suppression, wide passband and high rectangular coefficient. As discussed above, the hybrid filter of the present invention may be fabricated utilizing well established semiconductor processing equipment and processes, so the present invention has high process precision and is suitable for batch production or mass manufacturing.

The above description presents and describes the basic principles and main features of the present invention and the advantages of the present invention. Those skilled in the art should understand that the present invention is not limited by the foregoing embodiments. Those described in the foregoing embodiments and specification are only to illustrate the principles of the present invention. Various changes, modifications, equivalents, and improvements will be made to the present invention without departing from the spirit and scope of the present invention, all of which shall fall within the scope of the presently claimed invention.

In the present description of the invention and the associated claims, terms such as connected, connecting, coupled, coupling and the like are intended and understood to be synonymous and to mean either or both direct coupling or connection or indirect coupling or connection of two components, such that an additional element or component may be arranged therebetween.

The invention claimed is:

1. A hybrid band-pass filter, comprising:
   an input terminal for receiving an input signal;
   a first acoustic resonance unit coupled to the input terminal, said first acoustic resonance unit including a first series acoustic resonance unit and a first parallel acoustic resonance unit;
   a first port matching inductor having a first end coupled to said input terminal and a second end coupled to ground;
   a second matching inductor coupled at a first end to the series acoustic resonance unit of the first acoustic resonance unit, and at a second end to a filter;
   said filter being coupled to one end of a third matching inductor, another end of the third matching inductor being coupled to a second acoustic resonance unit, said second acoustic resonance unit including two parallel connected acoustic resonators having a series acoustic resonator connected between said parallel connected acoustic resonators;
   a second port matching inductor connected at one end to said second acoustic resonance unit and an output terminal of the hybrid band-pass filter, a second end of said second port matching inductor connected to ground;
   a matching substrate on which are arranged the first acoustic resonance unit, the filter, and the second acoustic resonance unit; and
   a polymer filled shell formed external to and encapsulating the first acoustic resonance unit, the filter, and the second acoustic resonance unit.

2. The hybrid band-pass filter according to claim 1, wherein the band-pass filter further comprises a plurality of series connected inductor capacitor pairs having a capacitor connected between each two series connected inductor capacitor pairs.

3. The hybrid band-pass filter according to claim 2, wherein at least one of the series connected inductor capacitor pairs includes an inductor connected to ground.

4. The hybrid band-pass filter according to claim 2, wherein at least one of the series connected inductor capacitor pairs includes a capacitor connected to ground.

5. The hybrid band-pass filter according to claim 1, wherein the filter further comprises a third order elliptic function high-pass filter.

6. The hybrid band-pass filter according to claim 1, wherein the filter comprises a high-pass filter, a low-pass filter, or a band-pass filter.

7. The hybrid band-pass filter according to claim 1, wherein each of the parallel connected acoustic resonators of the second acoustic resonator unit comprises a series connected acoustic resonator and inductor.

8. The hybrid band-pass filter according to claim 1, wherein at least one of the parallel connected acoustic resonators of the second acoustic resonator unit includes a series connected inductor and parallel acoustic resonator.

9. The hybrid band-pass filter according to claim 8, wherein said inductor of said at least one of the parallel connected acoustic resonators of the second acoustic resonator unit is connected at one end to ground and at another end to said parallel acoustic resonator, another end of said parallel acoustic resonator being connected to said second matching inductor and said second matching inductor.

10. The hybrid band-pass filter according to claim 1, wherein the first parallel acoustic resonance unit is connected to one end of the first series acoustic resonance unit, the first acoustic resonance unit further comprising a second parallel acoustic resonance unit connected to a second end of the series acoustic resonance unit.

11. The hybrid band-pass filter according to claim 1, wherein one or more of the series acoustic resonators or the parallel acoustic resonators each comprise two separate resonators, each separate resonator having a respective top electrode and respective bottom electrode, wherein the bottom electrodes are connected together.

* * * * *